US009835947B2

United States Patent
Seino et al.

(10) Patent No.: US 9,835,947 B2
(45) Date of Patent: Dec. 5, 2017

(54) SELF-ORGANIZATION MATERIAL AND PATTERN FORMATION METHOD

(71) Applicant: Kabushiki Kaisha Toshiba, Tokyo (JP)

(72) Inventors: Yuriko Seino, Tokyo (JP); Naoko Kihara, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/256,990

(22) Filed: Sep. 6, 2016

(65) Prior Publication Data
US 2017/0073542 A1 Mar. 16, 2017

(30) Foreign Application Priority Data

Sep. 11, 2015 (JP) .................................. 2015-180040

(51) Int. Cl.
*G03F 7/004* (2006.01)
*G03F 7/11* (2006.01)
(Continued)

(52) U.S. Cl.
CPC .......... *G03F 7/165* (2013.01); *B81C 1/00031* (2013.01); *B82Y 30/00* (2013.01);
(Continued)

(58) Field of Classification Search
CPC .......... G03F 7/002; G03F 7/40; G03F 7/0035; G03F 7/165; H01L 21/31144;
(Continued)

(56) References Cited

U.S. PATENT DOCUMENTS 8,080,363 B2 * 12/2011 Kanda ................... G03F 7/0046
428/482
8,815,493 B2 * 8/2014 Ito ......................... G03F 7/0046
430/270.1
(Continued)

FOREIGN PATENT DOCUMENTS

JP   2011-518652   6/2011
JP   2013-166933   6/2013
(Continued)

OTHER PUBLICATIONS

E. Huang et al., "Using Surface Active Random Copolymers to Control the Domain Orientation in Diblock Copolymer Thin Films" Macromolecules vol. 31, pp. 7641-7650 (1998).
(Continued)

*Primary Examiner* — Amanda C Walke
(74) *Attorney, Agent, or Firm* — Finnegan, Henderson, Farabow, Garrett & Dunner, L.L.P.

(57) ABSTRACT

A self-organization material according to an embodiment includes a block copolymer and a top coat material. The block copolymer contains a first block and a second block. The second block has a surface free energy higher than that of the first block. The top coat material contains a first portion having a surface free energy higher than that of the first block and lower than that of the second block, and a second portion having a surface free energy lower than that of the first block. The first portion is one of a homopolymer miscible with both the first block and the second block, and a random copolymer having a repeating unit of the first block and a repeating unit of the second block. The second portion is one of an organic siloxane-containing polymer and a fluorine-containing polymer.

20 Claims, 3 Drawing Sheets

(51) Int. Cl.

| | |
|---|---|
| *G03F 7/16* | (2006.01) |
| *C09D 153/00* | (2006.01) |
| *C09D 183/10* | (2006.01) |
| *C09D 133/12* | (2006.01) |
| *G03F 7/00* | (2006.01) |
| *G03F 7/40* | (2006.01) |
| *H01L 21/311* | (2006.01) |
| *H01L 21/306* | (2006.01) |
| *H01L 21/02* | (2006.01) |
| *H01L 21/027* | (2006.01) |
| *B81C 1/00* | (2006.01) |
| *B82Y 40/00* | (2011.01) |
| *B82Y 30/00* | (2011.01) |
| *C08G 77/44* | (2006.01) |

(52) U.S. Cl.
CPC ............ *B82Y 40/00* (2013.01); *C09D 133/12* (2013.01); *C09D 153/00* (2013.01); *C09D 183/10* (2013.01); *G03F 7/002* (2013.01); *G03F 7/0035* (2013.01); *G03F 7/11* (2013.01); *G03F 7/40* (2013.01); *H01L 21/0275* (2013.01); *H01L 21/02118* (2013.01); *H01L 21/30604* (2013.01); *H01L 21/31138* (2013.01); *H01L 21/31144* (2013.01); *B81C 2201/0149* (2013.01); *C08G 77/44* (2013.01)

(58) Field of Classification Search
CPC ........... H01L 21/0275; H01L 21/31138; H01L 21/02118; H01L 21/30604; B82Y 40/00; B82Y 30/00; B81C 1/00031; B81C 2201/0149
USPC ....... 430/322, 312, 313, 314, 325, 329, 330, 430/331; 438/703, 761; 216/41, 49, 67
See application file for complete search history.

(56) References Cited

U.S. PATENT DOCUMENTS

| | | | | |
|---|---|---|---|---|
| 8,841,058 | B2* | 9/2014 | Chang | .................. G03F 7/0046 430/270.1 |
| 9,458,348 | B2* | 10/2016 | Bae | ..................... H01L 21/3081 |
| 2009/0240001 | A1 | 9/2009 | Regner | |
| 2013/0209696 | A1 | 8/2013 | Sharma et al. | |
| 2013/0209755 | A1 | 8/2013 | Hustad et al. | |
| 2013/0280497 | A1* | 10/2013 | Wilson | ................. C09D 137/00 428/195.1 |
| 2013/0344242 | A1* | 12/2013 | Willson | .............. B81C 1/00031 427/240 |
| 2014/0065379 | A1 | 3/2014 | Nealey et al. | |
| 2014/0238954 | A1* | 8/2014 | Matsumiya | .......... C09D 153/00 216/67 |
| 2014/0377518 | A1 | 12/2014 | Trefonas, III et al. | |
| 2014/0378592 | A1 | 12/2014 | Trefonas, III et al. | |
| 2015/0197663 | A1 | 7/2015 | Mizutani et al. | |
| 2015/0232689 | A1* | 8/2015 | Willson | ............... C09D 153/00 428/195.1 |
| 2015/0291832 | A1* | 10/2015 | Seshimo | .............. C09D 153/00 427/379 |
| 2015/0370159 | A1* | 12/2015 | Willson | ............... C09D 137/00 428/447 |
| 2015/0376454 | A1* | 12/2015 | Zhang | .................. C09D 183/10 428/172 |
| 2016/0237307 | A1* | 8/2016 | Cheng | .................. C09D 169/00 |
| 2017/0139326 | A1* | 5/2017 | Willson | .................... G03F 7/20 |

FOREIGN PATENT DOCUMENTS

| | | |
|---|---|---|
| JP | 2013-166934 | 8/2013 |
| JP | 2014-70154 | 4/2014 |
| JP | 2015-7233 | 1/2015 |
| JP | 2015-42402 | 3/2015 |

OTHER PUBLICATIONS

C. M. Bates et al., "Polarity-Switching Top Coats Enable Orientation of Sub-10-nm Block Copolyrne Domains", Science, vol. 338, pp. 775-779 (2012).

H. Yoshida et al., "Topcoat Approaches for Directed Self-Assembly of Strongly Segregating Block Copolymer Thin Films", Journal of Photopolymer Science and Technology, vol. 26, No. 1, pp. 55-58 (2013).

* cited by examiner

SELF-ORGANIZATION MATERIAL AND PATTERN FORMATION METHOD

CROSS-REFERENCE TO RELATED APPLICATIONS

This application is based upon and claims the benefit of priority from Japanese Patent Applications No. 2015-180040, filed Sep. 11, 2015, the entire contents of which are incorporated herein by reference.

FIELD

Embodiments described herein relate generally to a self-organization material and a pattern formation method.

BACKGROUND

A block copolymer containing two immiscible blocks is known as a self-organization material. In self-organization of this block copolymer, a fine periodical structure is formed by causing phase separation into a phase of one block and a phase of the other block. This technique can form a structure finer than that obtained by lithography.

Examples of the periodical structure are a sphere (spherical structure), a cylinder (cylindrical structure), and a lamella (plate-like structure). Of these structures, the lamella structure is suitable for obtaining a line & space (L/S) pattern.

DETAILED DESCRIPTION

A self-organization material according to an embodiment includes a block copolymer and a top coat material. The block copolymer contains a first block and a second block. The second block has a surface free energy higher than that of the first block. The top coat material contains a first portion having a surface free energy higher than that of the first block and lower than that of the second block, and a second portion having a surface free energy lower than that of the first block. The first portion is a homopolymer miscible with both the first and second blocks, or a random copolymer having a repeating unit of the first block and a repeating unit of the second block. The second portion is an organic siloxane-containing polymer or fluorine-containing polymer.

Embodiments will be explained in detail below with reference to the accompanying drawings. Note that the same reference numerals denote constituent elements which achieve the same or similar functions throughout all the drawings, and a repetitive explanation will be omitted.

<Self-Organization Material>

First, a self-organization material according to an embodiment will be explained with reference to FIGS. 1, 2, and 3.

Figure 1:
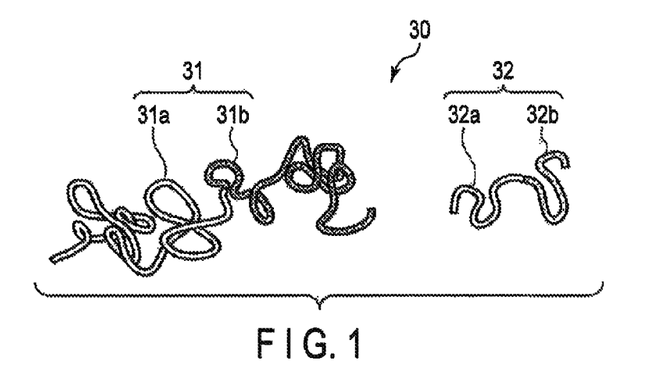
FIG. 1 is a view schematically showing a self-organization material according to an embodiment.

As shown in FIG. 1, a self-organization material 30 according to the embodiment contains a block copolymer 31 and a top coat material 32. Components contained in the self-organization material 30 will be explained below in order.

<Block Copolymer>

The block copolymer 31 contains one or more first blocks 31a and one or more second blocks 31b in a molecule. The first block 31a and second block 31b are immiscible. The second block 31b has a surface free energy higher than that of the first block 31a. The surface energy per unit surface area of each of the first block 31a and second block 31b is equal to a surface tension $\gamma$. When the surface tension $\gamma$ is represented by, e.g., the following equation:

$$\gamma = \gamma^d + \gamma^p,$$

where $\gamma^d$ is a dispersive component based on the van der Waals force, and $\gamma^p$ is a polar component based on others, $\gamma^d < \gamma^p$ preferably holds in the first block, and $\gamma^d > \gamma^p$ preferably holds in the second block.

The block copolymer 31 may be a diblock copolymer containing only one first block and one second block in a molecule. Alternatively, the block copolymer 31 may contain a total of three or more blocks in a molecule. For example, the block copolymer 31 may also be a triblock copolymer having a structure represented by "first block-second block-first block" or "second block-first block-second block".

Figure 2:
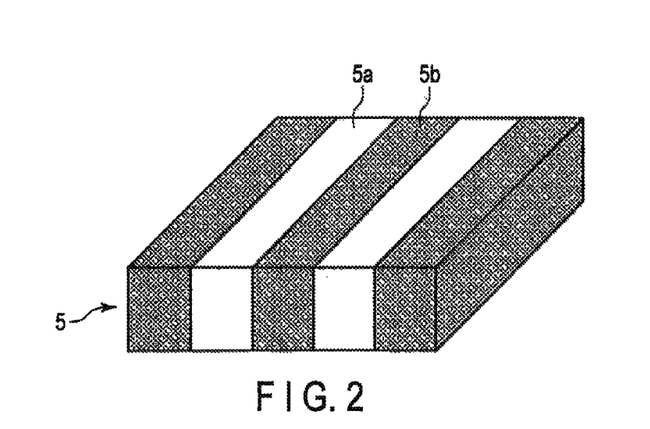
FIG. 2 is a perspective view schematically showing an example of a structure obtained by causing phase separation of a block copolymer contained in the self-organization material shown in FIG. 1.
Figure 3:
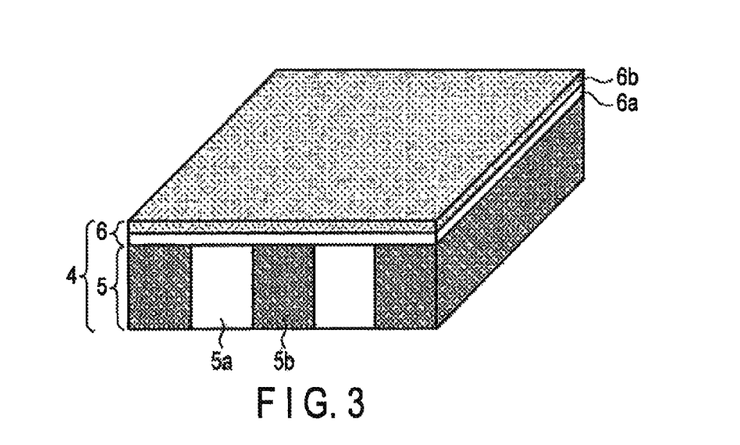
FIG. 3 is a perspective view schematically showing an example of a structure obtained by causing phase separation in the self-organization material shown in FIG. 1.

As shown in FIG. 2, it is possible to obtain a structure in which a phase 5a of the first block 31a and a phase 5b of the second block 31b are alternately arranged to form a stripe pattern, i.e., a lamella structure, by appropriately adjusting a volume fraction occupied by the first block 31a or second block 31b in the block copolymer 31 or the number-average molecular weight (Mn) of each block. The volume fractions of the first block 31a and second block 31b are, e.g., about 40:60 to about 60:40.

The number-average molecular weight of each block of the block copolymer 31 is not particularly limited as long as the molecular weight has a value capable of causing phase separation. To obtain a phase-separated pattern within a practical process time at a practical temperature, the number-average molecular weight (Mn) of each block is preferably 150,000 or less. The size of a separated phase changes in accordance with the molecular weight (polymerization degree N) of the polymer used and a Flory-Huggins interaction parameter $\chi$. To form a pattern having a sub-10-nm size, the number-average molecular weight (Mn) of each block is more preferably 20,000 or less and falls within the range ($\chi N > 10.5$) of the phase separation limit. "The number-average molecular weight (Mn)" herein mentioned is the number-average molecular weight obtained by gel permeation chromatography with use of polystyrene as a standard polymer.

At least one type of the blocks of the block copolymer 31 is a block (PA block) that is not removed but remains in development after phase separation to form a residual polymer phase. The remaining block is, e.g., a block (PB block) that is immiscible with the PA block and forms a development-removable polymer phase that is readily removable by development. Each of the PA and PB blocks can be one type of a block or two or more types of blocks. When the PB block includes two or more types of blocks, the different types of PB blocks can be either immiscible or miscible with each other.

Examples of a method of selectively removing the phase of the PB block by development include a dry developing method using plasma etching or the like, and a wet developing method that partially decomposes the polymer by ultraviolet irradiation and then dissolves it away with a developing solution. The PB block can be either a first block or second block.

The first block 31a and second block 31b are selected based on the surface free energy relationship between them.

The first block 31a is preferably a polymer having a relatively low surface free energy, e.g., polystyrene, polyvinylbiphenyl, polyvinylnaphthalene, polyvinylphenanthrene, polyvinylanthracene, polyvinylpyrene, polydimethylsiloxane, polyethylmethylsiloxane, polydimethylsiloxane, polydiethylsiloxane, polymethylphenylsiloxane, polydiphenylsiloxane, or polymethyl POSS acrylate.

As described previously, the second block 31b is a polymer having a surface free energy higher than that of the first block 31a, and is preferably polyvinylpyridine; polyacrylic ester such as methyl polyacrylate, ethyl polyacrylate, propyl polyacrylate, and hydroxyethyl polyacrylate; or polymethacrylic ester such as methyl polymethacrylate (polymethylmethacrylate), ethyl polymethacrylate, propyl polymethacrylate, and hydroxyethyl polymethacrylate.

In the embodiment, the second block 31b has a surface free energy higher than that of the first block 31a. The surface free energy herein mentioned is a surface free energy per unit area ($mJ/m^2$).

As an example, the block copolymer 31 in which the first block is polystyrene and the second block is polyvinylpyridine is used.

The dispersion degree (Mw/Mn) of the block copolymer 31 is preferably 1.0 to 2.0, more preferably 1.0 to 1.5, and most preferably 1.0 to 1.2. "A weight-average molecular weight (Mw)" is the weight-average molecular weight obtained by gel permeation chromatography with use of polystyrene as a standard polymer.

The ratio occupied by the block copolymer 31 in the solid content of the self-organization material 30 is preferably 70 to 99.9 mass %, and more preferably 80 to 99 mass %. This ratio is determined based on the phase separation size of the top coat material 32 and the desired film thickness of the block copolymer 31. If this ratio is too high, the appropriate film thickness of the block copolymer 31 decreases. On the other hand, if this ratio is too low, the appropriate film thickness of the block copolymer 31 increases.

<Top Coat Material>

Next, the top coat material 32 will be explained. The top coat material 32 contains a first portion 32a and a second portion 32b.

The first portion 32a has a surface free energy higher than that of the first block 31a of the block copolymer 31, and lower than that of the second block 31b of the block copolymer 31. The surface free energy of the first portion 32a is preferably almost the median between the surface free energies of the first block 31a and second block 31b of the block copolymer 31.

The second portion 32b has a surface free energy lower than that of the first block 31a of the block copolymer 31. That is, the second portion 32b has the lowest surface free energy among the blocks and portions contained in the self-organization material. The difference between the surface free energies of the first block 31a and second portion 32b is favorably as large as possible. The surface free energy of the second portion 32b is favorably 30 $mJ/m^2$ or less which is the surface free energy of a general organic polymer.

As the top coat material 32, used is a compound which has a large $\chi$ parameter (Flory-Huggins interaction parameter) contributing to phase separation and in which the second portion 32b is immiscible with the block copolymer 31. When using the top coat material 32 like this, as shown in FIG. 3, the self-organization material separates into a block copolymer phase and top coat material phase, thereby forming a first layer 5 of the block copolymer 31, and a second layer 6 of the top coat material 32 positioned above the first layer 5.

In the second layer 6 of the top coat material, a phase 6b of the second portion 32b having a low surface free energy is positioned at the outermost surface, and a phase 6a of the first portion 32a is positioned at an interface between the second layer 6 and the first layer 5 of the block copolymer. Since the first portion 32a of the top coat material 32 has a surface free energy higher than that of the first block 31a and lower than that of the second block 31b, the phase 6a of the first portion 32a has affinity for both the phase 5a of the first block 31a and the phase 5b of the second block 31b, and functions as a neutralization film. This makes it possible to suppress only a phase of a specific block in the first layer 5 of the block copolymer from coming into contact with the second layer 6.

When using a block copolymer having a large $\chi$ parameter in order to form a fine lamella structure, the following problems may arise if there is no second layer of the top coat material. For example, in the first layer of the block copolymer, only a phase of a block having a low surface free energy and a high affinity for air is positioned at the air interface during phase separation, so no vertical lamella structure is formed. Alternatively, even in the case where the surface free energy of the substrate is adjusted such that a vertical lamella is formed on the substrate surface, a phase of the first block 31a is formed at the air interface, and consequently a multilayered structure is formed in which the phase of the first block 31a is stacked on the vertical lamella.

When the second layer 6 of the top coat material is formed in accordance with the embodiment, a vertical lamella structure can be formed even in the case of using the block copolymer 31 having a large $\chi$ parameter. Therefore, a pattern having, e.g., a sub-10-nm size can be formed.

The first portion 32a is a homopolymer miscible with both the first block 31a and second block 31b, or a random copolymer having repeating units of the first and second blocks of the block copolymer 31.

When using a block copolymer containing, e.g., polystyrene and polyvinylpyridine as the block copolymer 31, methylester methacrylate can be used as the homopolymer miscible with both polystyrene and polyvinylpyridine. Also, a random copolymer containing polystyrene and polyvinylpyridine can be used as the random copolymer.

As the second portion 32b, an organic siloxane-containing polymer or fluorine-containing polymer can be used. As the organic siloxane-containing polymer, polydimethylsiloxane or the like can be used.

As the fluorine-containing polymer, it is possible to use, e.g., polymethacrylate or polystyrene substituted by a fluorine-substituted alkyl group. An example of the compound like this is a compound in which hydrogen in an ester part of polymethacrylate or in a benzene ring of polystyrene is substituted by a fluorine-substituted alkyl group such as trifluoroethyl, trifluoropropyl, or perfluorobutyl.

Alternatively, perfluoropolyether is used as the fluorine-containing polymer. As the perfluoropolyether, it is possible to use, e.g., compounds represented by formulas (I), (II), and (III) below:

HOCH$_2$CF$_2$O(CF$_2$CF$_2$O)$_p$(CF$_2$O)$_q$CF$_2$CH$_2$OH  (I)

HOOCCF$_2$O(CF$_2$CF$_2$O)$_m$(CFO)$_n$CF$_2$COOH  (II)

OCNC$_6$H$_3$(CH$_3$)NHCOCF$_2$O(CF$_2$CF$_2$O)$_m$
(CF$_2$O)$_n$CF$_2$CONH—C$_6$H$_3$(CH$_3$)—NCO  (III)

No phase separation may occur if the number-average molecular weight (Mn) of the top coat material 32 is too small. Therefore, the product of the χ parameter and the polymerization degree preferably satisfies a relationship represented by χN>10.5. Also, the volume ratio of the second portion 32b to the first portion 32a is favorably 40 to 60. The volume ratio of the two blocks falling within this range facilitates forming the second layer 6 of the top coat material in which the phase 6b of the second portion 32b is positioned on the outermost surface, and the phase 6a of the first portion 32a is positioned on the side of the interface between the first layer 5 of the block copolymer and the second layer 6. If the volume ratio is too high, for example, the top coat material may form a phase-separated shape such as a sphere or cylinder, and a lamella phase of the top coat material may not be formed. However, when this ratio falls within the abovementioned range, the formation of the second layer 6 of the top coat material can be promoted.

As an example, it is possible to use the top coat material 32 in which the first portion 32a is a random copolymer having a repeating unit of the first block 31a and a repeating unit of the second block 31b, and the second portion 32b is an organic siloxane-containing polymer or fluorine-containing polymer.

As another example, it is possible to use the top coat material 32 in which the first portion 32a is a homopolymer made from methacrylic ester, and the second portion 32b is a fluorine-containing polymer selected from perfluoropolyether and polystyrene substituted by a fluorine-substituted alkyl group.

<Solvent>

Optionally, the self-organization material 30 can further contain a solvent such as an organic solvent. The organic solvent is used to homogeneously mix the block copolymer 31 and top coat material 32, or change the self-organization material 30 into a liquid suitable for forming a coating film.

The organic solvent need only be capable of dissolving the block copolymer 31 and top coat material 32, thereby preparing a homogeneous solution. For example, it is possible to appropriately select one type or two or more types of known solvents such as a solvent for dissolving a high-molecular compound or a resist.

Examples of the organic solvent include lactones such as γ-butyrolactone; ketones such as acetone, methylethylketone, cyclohexanone, methyl-n-pentylketone, methylisopentylketone, and 2-heptanone; polyhydric alcohols such as ethyleneglycol, diethyleneglycol, propyleneglycol, and dipropyleneglycol; compounds having an ester bond such as ethyleneglycolmonoacetate, diethyleneglycolmonoacetate, propyleneglycolmonoacetate, and dipropyleneglycolmonoacetate; derivatives of the aforementioned polyhydric alcohols or the aforementioned compounds having an ester bond, e.g., derivatives having an ether bond, e.g., monoalkylethers such as monomethylether, monoethylether, monopropylether, and monobutylether, or monophenylether, preferably, propyleneglycolmonomethyletheracetate (PGMEA) or propyleneglycolmonomethylether (PGME); cyclic ethers such as dioxane and dioxolane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; amides such as dimethylformamide, dimethylacetamide, and N-methyl-2-pyrrolidone; sulfoxides such as dimethylsulfoxide; and aromatic organic solvents such as anisole, ethylbenzylether, cresylmethylether, diphenylether, phenetol, butylphenylether, ethylbenzene, diethylbenzene, pentylbenzene, isopropylbenzene, toluene, xylene, cymene, and mesitylene. These organic solvents can be used solely or in the form of a mixture of two or more types thereof.

The self-organization material 30 can be prepared by dissolving the block copolymer 31 and top coat material 32 in the organic solvent. If the top coat material 32 hardly dissolves in the above-described organic solvent, the self-organization material 30 can also be obtained by dissolving the block copolymer 31 in the above-described organic solvent to prepare a solution, dissolving the top coat material 32 in a polar solvent such as water, methanol, ethanol, isopropylalcohol, dimethylacetamide, or dimethylsulfoxide to prepare another solution, and mixing these solutions together.

<Additives>

Optionally, the self-organization material 30 can contain additives miscible with the mixture of the block copolymer 31 and top coat material 32, e.g., an additional resin, a surfactant for improving the coating properties, a plasticizer, a stabilizer, a coloring agent, an anti-halation agent, a dye, and a basic compound. The ratio of the additives in the solid component of the self-organization material 30 is, e.g., 5 mass % or less.

The above embodiment can provide a self-organization material capable of forming a fine lamella structure. A self-organization material like this can also form a lamella structure pattern having, e.g., a sub-10-nm size.

<Pattern Formation Method>

Next, an example of a pattern formation method using the above-described self-organization material will be explained with reference to FIGS. 4A, 4B, 4C, 4D, and 4E. The pattern formation method according to an embodiment is a method of forming a pattern by using phase separation of the above-described self-organization material.

More specifically, a layer 4 of the above-described self-organization material 30 is first formed on a support 3. In the layer 4, the self-organization material 30 is separated into a phase of the block copolymer 31 and a phase of the top coat material 32, thereby forming a first layer 5 of the block copolymer 31, and a second layer 6 of the top coat material 32 positioned above the first layer 5. In this embodiment, phase separation into the phase of the block copolymer 31 and the phase of the top coat material 32 will be referred to as first phase separation.

Note that the first layer 5 may also contain, e.g., the above-described solvent and additive, in addition to the block copolymer 31, and the second layer 6 may also contain the above-described solvent and additive, in addition to the top coat material 32.

Second phase separation and third phase separation to be explained below occur at the same time the abovementioned first phase separation occurs.

The second phase separation is phase separation in which the block copolymer 31 forms a phase 5a of the first block and a phase 5b of the second block in the first layer 5. With the aid of a structure formed by the third phase separation (to be described below), the phase 5a of the first block and the phase 5b of the second block form a lamella structure in which these phases are alternately arranged in a direction parallel to the substrate surface.

The third phase separation is phase separation in which the top coat material 32 forms a phase 6a of the first portion and a phase 6b of the second portion in the second layer 6. As shown in FIG. 3, this phase separation gives the second layer 6 a double-layered structure in which the phase 6b of the second portion 32b having a low surface free energy is positioned at the outermost surface, and the phase 6a of the first portion 32a is positioned at the interface between the first layer 5 of the block copolymer and the second layer 6.

Then, the second layer 6 is removed, and one of the phase 5a of the first block and the phase 5b of the second block is selectively removed from the first layer 5.

An example of this pattern formation method will be explained below with reference to FIGS. 4A, 4B, 4C, 4D, and 4E. Note that the pattern formation method to be explained below is an example, and the pattern formation method according to the embodiment is not limited to this.

Figure 4A:
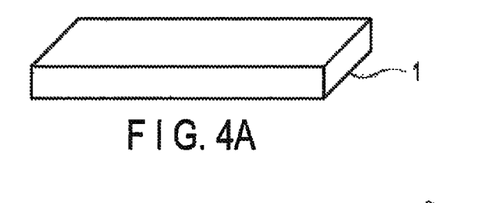
FIGS. 4A, 4B, 4C, 4D, and 4E are perspective views schematically showing an example of a pattern formation method using the self-organization material according to the embodiment.
Figure 4B:
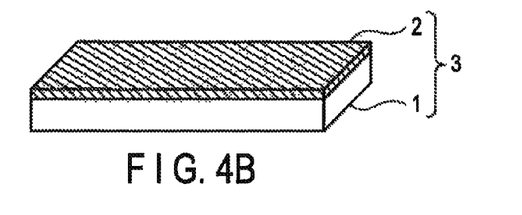

In this method, a support 3 shown in FIG. 4B is first obtained (step (1)). More specifically, a substrate 1 shown in FIG. 4A is prepared. Then, a layer (to be referred to as "an undercoating layer" hereinafter) 2 of an undercoating agent shown in FIG. 4B is formed on the substrate 1. The undercoating layer 2 functions as a neutralization film. Note that the undercoating layer 2 may also be omitted.

Figure 4C:
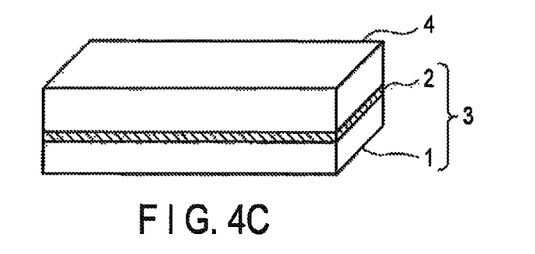
Figure 4D:
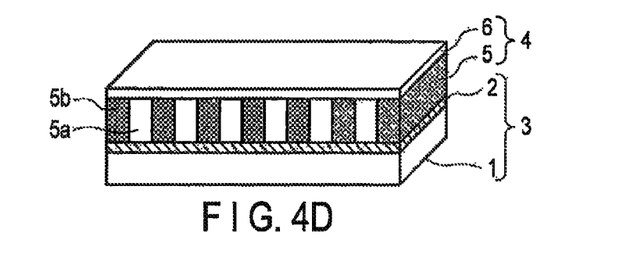

Then, as shown in FIG. 4C, a layer 4 of the self-organization material 30 is formed on the support 3. Subsequently, as shown in FIG. 4D, first phase separation is caused to form a first layer 5 of the block copolymer 31 on the support 3, and a second layer 6 of the top coat material 32 on the first layer 5. At the same time, second phase separation and third phase separation are caused to form a phase 5a of the first block and a phase 5b of the second block, and a phase 6a of the first portion and a phase 6b of the second portion as shown in FIG. 3 (step (2)).

Figure 4E:
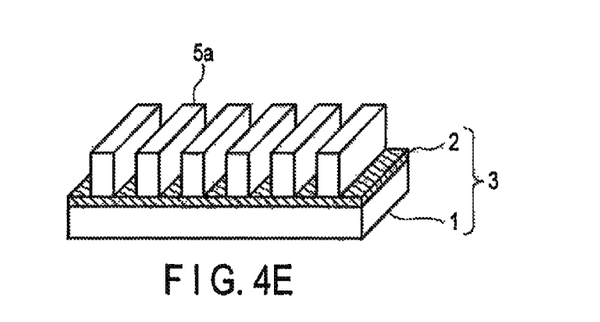

After that, as shown in FIG. 4E, the second layer 6 is removed, and one of the phase 5a of the first block and the phase 5b of the second block is selectively removed from the first layer 5 (step (3)). As an example, the phase 5b is selectively removed. Consequently, a pattern of the phase 5a is obtained.

Steps (1) to (3) will be explained in more detail below.

[Step (1)]

The substrate 1 is not particularly limited as long as the substrate neither dissolves nor mixes when coated with the undercoating agent or block copolymer. As the substrate 1, it is possible to use a conventionally known substrate such as a substrate for an electronic part.

Examples of the substrate 1 include a silicon wafer; a quartz-glass substrate; a metal substrate made of a metal such as gold, copper, chromium, iron, or aluminum; oxidized metal substrates obtained by oxidizing the aforementioned metals; and polymer films such as a polyethylene film, polyethyleneterephthalate film, polyimide film, and benzocyclobutene film.

The size and shape of the substrate 1 are not particularly limited. The substrate 1 need not have a smooth surface. Substrates made of various materials and having various shapes can appropriately be selected. For example, in addition to a substrate having a smooth surface, it is possible to use substrates having various shapes such as a substrate having a curved surface, a flat plate having a roughened surface, and a thin-plate-like substrate.

The substrate 1 may also be a substrate obtained by forming an inorganic and/or organic film on the substrate as described above. The substrate 1 is preferably a substrate obtained by forming an organic film on the substrate as described above. An example of the inorganic film is an inorganic anti-reflection film (inorganic BARC). An example of the organic film is an organic anti-reflection film (organic BARC).

The inorganic film can be formed by, e.g., coating a substrate with an inorganic anti-reflection film composition such as a silicon-based material, and sintering the substrate.

The organic film can be formed by coating, by a spinner or the like, a substrate with an organic film formation material obtained by dissolving, e.g., a resin component for forming the film in an organic solvent, and baking the substrate at preferably 80° C. to 300° C., and more preferably, 100° C. to 250° C. for preferably 30 to 300 sec, and more preferably, 60 to 180 sec. The organic film formation material herein used does not necessarily have sensitivity to light or an electron beam. That is, the organic film formation material may or may not have this sensitivity. More specifically, it is possible to use a resist or resin generally used in the manufacture of a semiconductor element or liquid-crystal display element.

Also, the organic film formation material is preferably a material capable of forming an organic film which can be processed by etching, particularly, dry etching, so that an organic film pattern can be formed by transferring a pattern of a block copolymer onto an organic film by etching the organic film by using the pattern. In particular, the organic film formation material is preferably a material capable of forming an organic film which can be processed by etching such as oxygen plasma etching. The organic film formation material like this can be a material conventionally used to form an organic film such as an organic BARC. Examples are the ARC series manufactured by Brewer Science, the AR series manufactured by Rohm & Haas, and the SWK series manufactured by TOKYO OHKA KOGYO.

The undercoating agent contains a group which interacts with the substrate 1. Since this group exists, the substrate 1 and undercoating layer 2 can satisfactorily interact with each other even when using the substrate 1 on which the organic film or the like as described above is formed. Consequently, the undercoating layer 2 can be formed as a strong and highly adhesive film.

Also, the surface of the substrate 1 can be cleaned beforehand. When the substrate surface is cleaned, it is sometimes possible to satisfactorily perform a later neutralization reaction process.

As the cleaning process, conventionally known methods can be used. Examples of the cleaning process are oxygen plasma processing, an ozone oxidation process, acid-alkali processing, and a chemical modification process.

The undercoating layer 2 is formed by, e.g., coating the substrate 1 with the undercoating agent. For example, the undercoating layer 2 can be formed by forming a coating film by coating the substrate 1 with the undercoating agent by a conventionally known method such as spin coating, and drying the coating film. Details of the undercoating agent will be described later.

The coating film drying method need only be able to volatilize the organic solvent contained in the undercoating agent, and an example is a baking method.

The baking temperature is preferably 80° C. to 300° C., more preferably, 100° C. to 270° C., and further preferably, 120° C. to 250° C. The baking time is preferably 30 sec to 24 hrs, and more preferably, 60 sec to 2 hrs.

When the undercoating layer 2 is formed on the surface of the substrate 1, the surface of the substrate 1 is neutralized. This makes it possible to suppress only one of the phase 5a of the first block and the phase 5b of the second block, which are formed by phase separation of the block copolymer 31, from coming into contact with the substrate surface. Accordingly, it is possible to form a lamella structure in which the phase 5a of the first block and the phase 5b of the second block are alternately arrayed, and which is oriented perpendicularly to the substrate.

(Undercoating Agent)

As the undercoating agent, a material having affinity for both the phase 5a of the first block and the phase 5b of the second block is used. More specifically, a material having a surface free energy higher than that of the first block 31a of the block copolymer 31 and lower than that of the second block 31b thereof is used. In this case, the solubility parameter of the undercoating agent is also desirably intermediate between the solubility parameters of the polymers of the first block 31a and second block 31b of the block copolymer 31.

A resin composition or the like can be used as the undercoating agent. This resin composition to be used as the undercoating agent can appropriately be selected from conventionally known resin compositions for use in thin film formation, in accordance with the types of blocks of the block copolymer 31. This resin composition can be either a thermally polymerizable resin composition or photosensitive resin composition. The resin composition can also be a composition capable of forming a pattern, e.g., a positive resist composition or negative resist composition.

The undercoating layer 2 may also be a non-polymerizable film. For example, a siloxane-based organic monomolecular film made of phenethyltrichlorosilane, octadecyltrichlorosilane, or hexamethyldisilazane can suitably be used as the undercoating layer 2.

Examples of the undercoating agent like this are a resin containing all of the block constituent units of the block copolymer 31, a resin containing a plurality of constituent units having a high affinity to the blocks of the block copolymer 31, and compositions containing these resins.

For example, when using a block copolymer containing a block of polystyrene (PS) and a block of polymethylmethacrylate (PMMA), it is favorable to use a resin containing both a constituent unit derived from styrene and a constituent unit derived from methylmethacrylate; or a resin containing both a portion having a high affinity to PS, e.g., an aromatic ring, and a portion having a high affinity to PMMA, e.g., a highly polar functional group.

An example of the resin containing both the constituent unit derived from styrene and the constituent unit derived from methylmethacrylate is a random copolymer obtained by randomly polymerizing styrene and methylmethacrylate.

An example of the resin containing both the portion having a high affinity to PS and the portion having a high affinity to PMMA is a resin obtained by polymerizing at least a monomer having an aromatic ring and a monomer having a highly polar substituent group.

An example of the monomer having an aromatic ring is a monomer containing a group in which one hydrogen atom is removed from the ring of aromatic hydrocarbon, e.g., a phenyl group, biphenyl group, fluorenyl group, naphthyl group, anthryl group, or phenanthrene group, and a heteroaryl group in which some carbon atoms forming the ring of the above group are substituted with hetero atoms such as oxygen atoms, sulfur atoms, or nitrogen atoms.

An example of the monomer having a highly polar substituent group is a monomer containing a hydroxylalkyl group in which some hydrogen atoms of a trimethoxysilyl group, trichlorosilyl group, carboxy group, hydroxyl group, cyano group, amino group, or alkyl group are substituted with fluorine atoms.

Examples of the compound containing both the portion having a high affinity to PS and the portion having a high affinity to PMMA are a compound containing both an aryl group such as phenethyltrichlorosilane and a highly polar substituent group, and a compound containing both an alkyl group such as an alkylsilane compound and a highly polar substituent group.

Before the layer 4 of the self-organization material is formed, a guide pattern may also be formed in advance on the substrate 1 or on the substrate 1 including the undercoating layer 2. The formation of this guide pattern facilitates controlling the array in the structure obtained by phase separation, in accordance with the shape and surface characteristic of the pattern.

For example, even when using a block copolymer which forms a random fingerprint-like structure when there is no guide pattern, a self-organized pattern oriented in a desired direction can be obtained in a desired area by forming a trench structure as a guide pattern by forming, e.g., a resist film on the substrate surface. This is very effective as a method of forming a part of a component of a designed electronic device.

More specifically, the substrate surface is coated with a resist composition by using a spinner or the like, and pre-bake (PAB (Post Apply Bake)) is performed for, e.g., 40 to 120 sec, and preferably, 60 to 90 sec at a temperature of, e.g., 80° C. to 150° C. Then, the prebaked substrate is exposed to a desired pattern by an ArF excimer laser beam by using an ArF exposure apparatus and mask pattern. Subsequently, PEB (Post Exposure Baking) is performed on the exposed substrate at a temperature of, e.g., 80° C. to 150° C. for, e.g., 40 to 120 sec, and preferably, 60 to 90 sec. After that, the baked substrate is developed by using an alkali developing solution, e.g., an aqueous 0.1- to 10-mass % tetramethylammonium hydroxide (TMAH) solution, rinsed by preferably using pure water, and dried. A baking process (post-bake) may also be performed after the above-mentioned developing process in some cases. Thus, a guide pattern faithful to the mask pattern can be formed.

The type of the guide pattern can be either a chemical guide or physical guide. The height of the guide pattern from the substrate surface (or the undercoating layer surface) can appropriately be adjusted by, e.g., the film thickness of a resist film to be patterned into the guide pattern.

The resist composition to be used to form the guide pattern is appropriately selected from, e.g., resist compositions and their modified products which are generally used to form a resist pattern and have affinity to any block forming the block copolymer 31. An example of the resist composition is a resist composition which generates an acid by exposure and changes the solubility in a developing solution in accordance with the action of the acid. The resist composition can be either a positive resist composition which forms a positive pattern from which an exposed portion is dissolved away, or a negative resist composition which forms a negative pattern from which an unexposed portion is dissolved away, and is preferably the negative resist composition. For example, the negative resist composition is preferably a resist composition containing an acid generating agent, and a base component which reduces the solubility in a developing solution containing an organic solvent in accordance with the action of the acid, and contains a resin component having a constituent unit which decomposes due to the action of the acid and increases the polarity.

Thermal annealing is sometimes performed as annealing for promoting phase separation of the self-organization material supplied on the substrate surface. In this case, the resist composition for forming the guide pattern is preferably a material capable of forming a resist film having a high solvent resistance and high heat resistance.

[Step (2)]

The method of forming the layer 4 is not particularly limited. For example, the layer 4 can be formed by coating the undercoating layer 2 with the self-organization material 30, and drying the coating film as needed. Examples of the coating method are a spin coating method, dip coating method, and inkjet method.

The thickness of the layer 4 can be a thickness sufficient to form the first layer 5 and second layer 6 by causing the first phase separation of the self-organization material 30. This thickness is not particularly limited. However, when taking account of, e.g., the sizes of phases (domains) to be formed by the first phase separation and second phase separation, the uniformity of the structure obtained by phase separation, and the prevention of pattern collapse after etching, the thickness is preferably about 0.5 to 3 times, and more preferably about 1.0 to 2 times the phase separation pitch of the self-organization material 30.

The first phase separation and second phase separation in the layer 4 are caused by, e.g., heat-treating (thermally annealing) the support 3. In this case, the structure obtained by the second phase separation is a structure in which the phases of the individual blocks are alternately arrayed in the direction perpendicular to the surface of the substrate 1. Accordingly, when one of the blocks is selectively removed in the subsequent step, the substrate surface where the removed block existed is exposed. The temperature of the heat treatment is preferably equal to or higher than the glass transition temperature of the first layer 5 and lower than the thermal decomposition temperature thereof. For example, when the block copolymer 31 is PS-PMMA, the heat treatment is favorably performed at 160° C. to 270° C. for 30 to 3,600 sec. Also, the heat treatment is favorably performed in a low-reactivity gas such as nitrogen or in a vacuum.

[Step (3)]

In step (3), a pattern is formed by selectively removing one of the first-block phase and second-block phase of the block copolymer forming the first layer 5. As an example, the phase 5b is selectively removed.

For example, the molecular weight of at least one block in the phases 5b is selectively decreased. Accordingly, the solubility in a developing solution is increased for the blocks in the phases 5b when compared to the blocks in the phases 5a. As a consequence, the phases 5a are selectively removed more easily than the phases 5b.

This selective removing process is not particularly limited as long as the process has no influence on the PA block and can decompose and remove the PB block. This selective removing process can properly be selected from methods which are used to remove a resin film, in accordance with the types of the PA block and PB block. When an undercoating layer 2 is formed on the surface of the substrate 1 in advance, the undercoating layer 2 is also removed like the phase of the PB block. Examples of the removing process are oxygen plasma processing, ozone processing, an UV irradiation process, a thermal decomposition process, and a chemical decomposition process.

The substrate on which the pattern is formed as described above can directly be used in the next step, and can also be subjected to a heat treatment, a chemical treatment, or the like as needed.

[Modification of Pattern Formation Method]

The above-described, self-organization material 30 can also be used in another pattern formation method. This pattern formation method will be explained with reference to FIGS. 5A, 5B, 5C, and 5D.

Figure 5A:
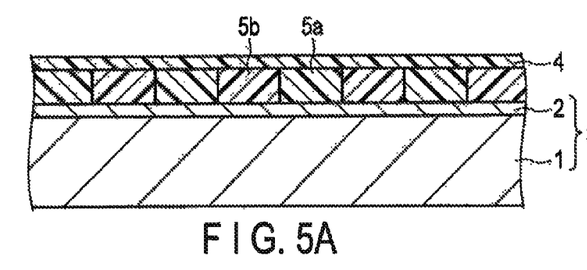
FIGS. 5A, 5B, 5C, and 5D are sectional views schematically showing another example of the pattern formation method using the self-organization material according to the embodiment.

First, a structure shown in FIG. 5A is obtained by the same method as explained with reference to FIGS. 4A, 4B, 4C, and 4D. Referring to FIG. 5A, phases 5a are phases of the first block 31a, and phases 5b are phases of the second block 31b.

Figure 5B:
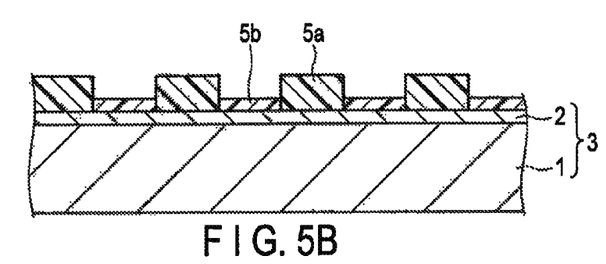

Then, as shown in FIG. 58B, recesses are formed in the positions of the phases 5b by reducing the thickness of the phases 5b. The thickness of the phases 5b can be reduced by, e.g., the method explained in step (3) described above.

Figure 5C:
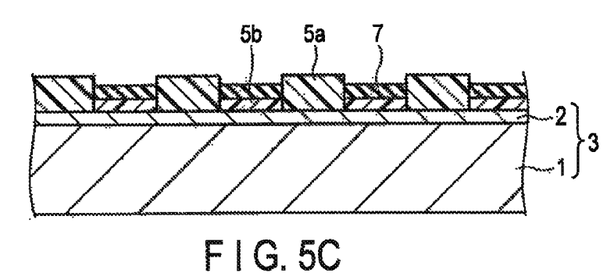

Subsequently, the surface in which the recesses are formed is coated with a coating solution containing the material of an etching mask (to be described later). For example, the surface in which the recesses are formed is spin-coated with a spin-on-glass material. Then, an etching mask 7 shown in FIG. 5C is obtained by curing the coating film.

When a substance dissolved or dispersed in the coating solution has a sufficiently high affinity to the phases 5b compared to the phases 5a, the etching mask 7 can be formed on only the phases 5b.

Also, the coating film can be formed to have a large thickness because the recesses are formed in the positions of the phases 5b. Therefore, a sufficiently thick etching mask 7 can be obtained.

Figure 5D:
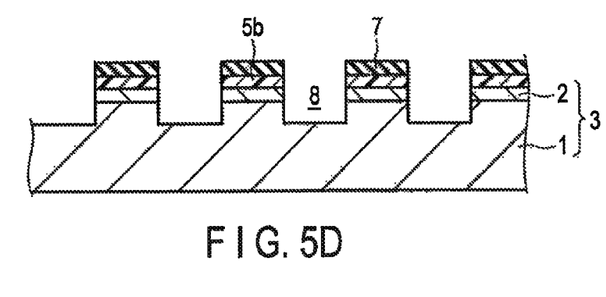

After that, the phases 5a are removed by etching. Furthermore, those portions of the undercoating layer 2 and substrate 1, which are positioned below the phases 5a, are etched away as needed. When the undercoating layer 2 is made of a resin or carbon, those portions of the undercoating layer 2, which are positioned below the phases 5a, can be removed by continuing etching for removing the phases Sa even after the phases 5a are removed. Also, the etching mask 7 is sufficiently thick and made of a material having a high etching resistance. Therefore, the etching mask 7 sufficiently functions as an etching mask even when etching away those portions of the substrate 1, which are positioned below the phases 5a. Accordingly, a structure in which a trench portion 8 is formed, as shown in, e.g., FIG. 5D is obtained.

This method can remove the phases 5a and leave the phases 5b behind, unlike the method described with reference to FIGS. 4A, 4B, 4C, 4D, and 4E. Also, this method can form the etching mask 7 having a high etching resistance.

The above embodiment can form a fine line & space (L/S) pattern, and can also form a line & space (L/S) pattern having, e.g., a sub-10-nm size.

Note that as an example, there is provided a self-organization material containing a block copolymer which contains a first block and second block, and in which the second block has a surface free energy higher than that of the first block, and a top coat material which contains a first portion having a surface free energy higher than that of the first block and lower than that of the second block, and a second portion having a surface free energy lower than that of the first block, wherein the first portion is a random copolymer having a repeating unit of the first block and a repeating unit of the second block.

Example 1

Polystyrene-poly-2-vinylpyridine (PS-b-P2VP) was used as a block copolymer for forming a lamella structure. The molar mass of PS was 25 kg/mol, and that of P2VP was 25 kg/mol.

Polymethylmethacrylate-polydimethylsiloxane (PMMA-b-PDMS) was used as a top coat material. The number-average molecular weight (Mn) of PMMA was 9,000, and that of PDMS was 8,000.

The block copolymer for forming a lamella structure and the top coat material were dispersed in a solvent such that the volume ratio of the solid content was 83:17, thereby preparing a processing solution as a self-organization material. PGMEA was used as the solvent.

On a silicon substrate, an undercoating layer of polystyrene-r-poly-2-vinylpyridine (PS-r-P2VP) copolymer was formed. The substrate was coated with the abovementioned processing solution, thereby forming a 60-nm thick film of the self-organization material. Subsequently, the substrate was heated on a hotplate, thereby forming a top coat layer of PMMA-b-PDMS, and causing phase separation of the block copolymer for forming a lamella structure. The heating conditions were 170° C. and 15 hrs, and heating was performed in a vacuum.

Then, a PDMS block as a layer on the outermost surface was etched away by using tetrafluoromethane ($CF_4$) gas. When observation was performed using a scanning electron microscope (SEM), a lamella structure in which phases were alternately arrayed was formed, and the half pitch of the structure was 19 nm.

Example 2

P2VP-b-PS-b-P2VP was used as a block copolymer for forming a lamella structure. The molar mass of one P2VP was 8 kg/mol, that of PS was 17 kg/mol, and that of the other P2VP was 8 kg/mol.

Perfluoroether-polymethylmethacrylate-1 (PF-PMMA-1) was used as a top coat material. PF-PMMA-1 was obtained by synthesizing a triblock copolymer by dehydration of perfluoroether having an OH group at the two ends indicated by formula (I) below, and PMMA having COOH at the end.

$$HOCH_2CF_2O(CF_2CF_2O)_p(CF_2O)_qCF_2CH_2OH \quad (I)$$

The number-average molecular weight (Mn) of PF was 2,000, and that of PMMA used was 1,000.

The block copolymer for forming a lamella structure and the top coat material were dispersed in a solvent such that the volume ratio of the solid content was 86:14, thereby preparing a processing solution as a self-organization material. PGMEA was used as the solvent.

On a silicon substrate, an undercoating layer of polystyrene-r-poly-2-vinylpyridine (PS-r-P2VP) copolymer was formed. The substrate was coated with the abovementioned processing solution, thereby forming a 35-nm thick film of the self-organization material. Subsequently, the substrate was heated on a hotplate, thereby forming a top coat layer of PF-PMMA-1, and causing phase separation of the block copolymer for forming a lamella structure. The heating conditions were 170° C. and 15 hrs, and heating was performed in a vacuum.

Then, a PF block as a layer on the outermost surface was etched away by using oxygen gas. When observation was performed using a scanning electron microscope (SEM), a lamella structure in which phases were alternately arrayed was formed, and the half pitch of the structure was 8 nm.

Example 3

A processing solution as a self-organization material was prepared following the same procedures as in Example 1 except that a random copolymer of polystyrene and polyvinylpyridine and a block copolymer of polydimethylsiloxane ((PS-r-PMMA)-b-PDMS) were used as top coat materials. The number-average molecular weight (Mn) of PS-r-PMMA was 8,000, and that of PDMS was 8,000. Following the same procedures as in Example 1, a film of the self-organization material was formed on a silicon substrate by using the prepared processing solution, and phase separation was caused.

Etching was performed on the phase-separated film by using tetrafluoromethane ($CF_4$) gas, thereby removing a PDMS block as a layer on the outermost surface. When observation was performed using a scanning electron microscope (SEM), a lamella structure in which phases were alternately arrayed was formed, and the half pitch of the structure was 19 nm.

Comparative Example 1

PS-b-P2VP was used as a block copolymer for forming a lamella structure. The molar mass of PS was 25 kg/mol, and that of P2VP was 25 kg/mol.

The block copolymer for forming a lamella structure was dispersed in a solvent, thereby preparing a processing solution as a self-organization material. PGMEA was used as the solvent.

An undercoating layer of PMMA was formed on a silicon substrate. The substrate was coated with the abovementioned processing solution, thereby forming a 50-nm thick film of the self-organization material. Subsequently, the substrate was heated on a hotplate, thereby causing phase separation of the block copolymer for forming a lamella structure. The heating conditions were 170° C. and 15 hrs, and heating was performed in a vacuum.

When the surface of the heated substrate was observed with a scanning electron microscope (SEM), the film thickness changed from one portion to another, i.e., there was a film height difference. From the foregoing, a lamella structure perpendicular to the substrate was not formed in Comparative Example 1.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A self-organization material comprising:
    a block copolymer containing a first block and a second block, the second block having a surface free energy higher than a surface free energy of the first block;
    a top coat material which contains a first portion having a surface free energy higher than that of the first block and lower than that of the second block, and a second portion having a surface free energy lower than that of the first block, the first portion being one of a homopolymer miscible with both the first block and the second block, and a random copolymer having a repeating unit of the first block and a repeating unit of the second block, and the second portion being one of an organic siloxane-containing polymer and a fluorine-containing polymer.

2. The self-organization material according to claim 1, wherein the first block is composed of polystyrene, and the second block is composed of polyvinylpyridine.

3. The self-organization material according to claim 1, wherein the first portion is a random copolymer having the repeating unit of the first block and the repeating unit of the second block, and the second portion is one of the organic siloxane-containing polymer and the fluorine-containing polymer.

4. The self-organization material according to claim 3, wherein the first block is composed of polystyrene, and the second block is composed of polyvinylpyridine.

5. The self-organization material according to claim 1, wherein the second portion is polydimethylsiloxane.

6. The self-organization material according to claim 1, wherein the second portion is a material selected from the group consisting of perfluoropolyether, polymethacrylate substituted by a fluorine-substituted alkyl group, and polystyrene substituted by a fluorine-substituted alkyl group.

7. The self-organization material according to claim 1, wherein the first portion is a homopolymer composed of methacrylic ester, and the second portion is a material selected from the group consisting of perfluoropolyether and polystyrene substituted by a fluorine-substituted alkyl group.

8. The self-organization material according to claim 7, wherein the first block is composed of polystyrene, and the second block is composed of polyvinylpyridine.

9. The self-organization material according to claim 1, wherein the second portion is a material selected from the group consisting of compounds represented by formulas (I), (II), and (III) below:

$$HOCH_2CF_2O(CF_2CF_2O)_p(CF_2O)_qCF_2CH_2OH \quad (I)$$

$$HOOCCF_2O(CF_2CF_2O)_m(CFO)_nCF_2COOH \quad (II)$$

$$OCNC_6H_3(CH_3)NHCOCF_2O(CF_2CF_2O)_m(CF_2O)_nCF_2CONH\text{—}C_6H_3(CH_3)\text{—}NCO \quad (III).$$

10. A pattern formation method comprising:
forming a layer of the self-organization material according to claim 1 on a substrate;
causing first phase separation of the self-organization material into a phase of the block copolymer and a phase of the top coat material to form a first layer containing the block copolymer and a second layer positioned above the first layer and containing the top coat material, and causing second phase separation of the block copolymer into a phase of the first block and a phase of the second block to form a lamella structure in which the phase of the first block and the phase of the second block are alternately arranged in a direction parallel to a surface of the substrate; and
removing the second layer and one of the phase of the first block and the phase of the second block.

11. The method according to claim 10, wherein the first phase separation and the second phase separation are caused by heat-treating the layer of the self-organization material.

12. The method according to claim 10, further comprising, before forming the layer of the self-organization material, forming, on the substrate, an undercoating layer of a material having a surface free energy higher than the surface free energy of the first block and lower than the surface free energy of the second block.

13. The method according to claim 10, wherein the first block is composed of polystyrene, and the second block is composed of polyvinylpyridine.

14. The method according to claim 10, wherein the first portion is a random copolymer having the repeating unit of the first block and the repeating unit of the second block, and the second portion is one of the organic siloxane-containing polymer and the fluorine-containing polymer.

15. The method according to claim 14, wherein the first block is composed of polystyrene, and the second block is composed of polyvinylpyridine.

16. The method according to claim 10, wherein the second portion is polydimethylsiloxane.

17. The method according to claim 10, wherein the second portion is a material selected from the group consisting of perfluoropolyether, polymethacrylate substituted by a fluorine-substituted alkyl group, and polystyrene substituted by a fluorine-substituted alkyl group.

18. The method according to claim 10, wherein the first portion is a homopolymer composed of methacrylic ester, and the second portion is a material selected from the group consisting of perfluoropolyether and polystyrene substituted by a fluorine-substituted alkyl group.

19. The method according to claim 18, wherein the first block is composed of polystyrene, and the second block is composed of polyvinylpyridine.

20. The method according to claim 10, wherein the second portion is a material selected from the group consisting of compounds represented by formulas (I), (II), and (III) below:

$$HOCH_2CF_2O(CF_2CF_2O)_p(CF_2O)_qCF_2CH_2OH \quad (I)$$

$$HOOCCF_2O(CF_2CF_2O)_m(CFO)_nCF_2COOH \quad (II)$$

$$OCNC_6H_3(CH_3)NHCOCF_2O(CF_2CF_2O)_m(CF_2O)_nCF_2CONH\text{—}C_6H_3(CH_3)\text{—}NCO \quad (III).$$

* * * * *